United States Patent
Liu et al.

(10) Patent No.: US 7,489,982 B2
(45) Date of Patent: Feb. 10, 2009

(54) METHOD AND SOFTWARE FOR CONDUCTING EFFICIENT LITHOGRAPHY WPH / LOST TIME ANALYSIS IN SEMICONDUCTOR MANUFACTURING

(75) Inventors: Kun-Yi Liu, Vancouver, WA (US); Dean Yi Liu, Vancouver, WA (US)

(73) Assignee: Wafertech, LLC, Camas, WA (US)

( * ) Notice: Subject to any disclaimer, the term of this patent is extended or adjusted under 35 U.S.C. 154(b) by 0 days.

(21) Appl. No.: 11/521,871

(22) Filed: Sep. 15, 2006

(65) Prior Publication Data

US 2008/0071405 A1    Mar. 20, 2008

(51) Int. Cl.
*G06F 19/00* (2006.01)
(52) U.S. Cl. ............................. 700/121; 414/804
(58) Field of Classification Search ......... 700/100–105, 700/107, 110, 97, 174, 121; 414/804, 806
See application file for complete search history.

(56) References Cited

U.S. PATENT DOCUMENTS

| | | | | |
|---|---|---|---|---|
| 7,054,702 | B1 * | 5/2006 | Barto et al. ................. | 700/100 |
| 2004/0091349 | A1 * | 5/2004 | Tabrizi et al. ............... | 414/804 |
| 2004/0107014 | A1 * | 6/2004 | Park ........................... | 700/90 |
| 2005/0256600 | A1 * | 11/2005 | Nakasugi .................... | 700/100 |

* cited by examiner

*Primary Examiner*—Kidest Bahta
(74) *Attorney, Agent, or Firm*—Duane Morris LLP

(57) ABSTRACT

A method and a computer readable medium includes instructions for obtaining time data as programmed into processing recipes or as recorded when a wafer is processed and transferred during lithography operations. The data is parsed and saved into an MES database. A report server accesses the database responsive to a query made of the database. A query may specify one or more fabrication parameters. The specified fabrication parameter or parameters is fixed and a data display is provided that compares times for processing and transferring wafers in various lithography operations used in the production of the semiconductor device and bottlenecks in lithography operations are identified by the comparative data.

20 Claims, 13 Drawing Sheets

FIG. 2

Photo Wafer WPH Report

Start From: [ 32 ] [ 32 ] -To: [ 32 ] [ 32 ]

Lot ID: [ 32 ] ex: WC to list all WC* lots or empty for all lots

Tool ID: [ 32 ] ex: WPPHC or WPPHC2 or empty to list all tools

Reticle ID: [ K052160 ] ex: J419 or J419185E or 185E or empty to list all reticles ☐ Show Energy and Technology ☐ Show SQL (For automation use only)

[ Query ]

FIG. 3

Photo Wafer WPH Report

Start From:

P_TIME > 17 MINS
F787197 STILL USING
OLD LOW STEPPER JOB

Photo Tool Wafer Process Time

| TOOL_ID | LOT_ID | BATCH | P_TIME | LOST_TIME | RETICLE_ID | CHG | RECIPE_ID | LOT_START_TS | LOT_END_TS | WFRS | AVG_P | MAX_P | MIN_P | AVG_T | MAX_T | MIN_T | WPH |
|---|---|---|---|---|---|---|---|---|---|---|---|---|---|---|---|---|---|
| WPPHC5#1 | WC9125.00 | 1 | 20.71 | | F787197A | | 1060G87 | 2005-10-08 00:03:15.0 | 2005-10-08 00:23:48.0 | 25 | 44 | 57 | 40 | 5 | 6 | 5 | 72.40 |
| WPPHC5#1 | WC9204.00 | 1 | 20.75 | 0.56 | F787197A | | 0060C87 | 2005-10-08 00:24:22.0 | 2005-10-08 00:45:07.0 | 25 | 44 | 57 | 35 | 5 | 14 | 4 | 72.28 |
| WPPHC5#1 | WZ1387.00 | 1 | 15.48 | 0.96 | K803198B | | 1060G87 | 2005-10-08 00:46:05.0 | 2005-10-08 01:01:34.0 | 25 | 27 | 39 | 23 | 10 | 32 | 4 | 96.87 |
| WPPHC5#1 | WZ1383.00 | 1 | 16.26 | 1.01 | K803198B | | 0060G87 | 2005-10-08 01:02:35.0 | 2005-10-08 01:18:51.0 | 25 | 27 | 46 | 12 | 12 | 40 | 1 | 92.21 |
| WPPHC5#1 | WC9340.00 | 1 | 16.30 | 1.30 | Q250197A | | 1060G87 | 2005-10-08 01:20:09.0 | 2005-10-08 01:36:27.0 | 25 | 33 | 46 | 33 | 5 | 6 | 5 | 92.02 |
| WPPHC5#1 | WC9311.00 | 1 | 14.88 | 1.28 | N700198A | | 1060G87 | | | 25 | 28 | 41 | 24 | 7 | 29 | 5 | 100.78 |
| WPPHC5#1 | WC8948.00 | 1 | 16.98 | 3.16 | K051155A | | 1060GG7 | LOST TIME TOO LONG | | 25 | 34 | 47 | 34 | 6 | 26 | 5 | 88.32 |
| WPPHC5#1 | WC8949.00 | 1 | 16.55 | 1.68 | K051155A | | 0060GG7 | | | 25 | 34 | 45 | 31 | 5 | 6 | 5 | 90.63 |
| WPPHC5#1 | WC8792.00 | 1 | 16.63 | 1.61 | K051155A | | 0060GG7 | | | 25 | 34 | 46 | 34 | 5 | 6 | 5 | 90.18 |
| WPPHC5#1 | WZ1384.00 | 1 | 14.86 | 1.96 | K803197A | | 1060G87 | 2005-10-08 02:50:37.0 | 2005-10-08 03:05:29.0 | 25 | 27 | 40 | 27 | 8 | 31 | 5 | 100.89 |
| WPPHC5#1 | WC8942.00 | 1 | 16.61 | 8.05 | K051155A | | 1060GG7 | 2005-10-08 03:13:32.0 | 2005-10-08 03:30:09.0 | 25 | 34 | 46 | 34 | 5 | 6 | 5 | 90.27 |
| WPPHC5#1 | WC8941.00 | 1 | 16.93 | 1.38 | K051155A | | 0060GG7 | 2005-10-08 03:31:32.0 | 2005-10-08 03:48:28.0 | 25 | 34 | 46 | 34 | 6 | 24 | 5 | 88.58 |
| WPPHC5#1 | WC9515.00 | 1 | 17.33 | 2.76 | L697155A | | 1060GG7 | 2005-10-08 03:51:14.0 | 2005-10-08 04:08:34.0 | 25 | 32 | 44 | 28 | 9 | 35 | 5 | 86.53 |
| WPPHC5#1 | WZ1377.00 | 1 | 15.35 | 2.98 | K803197A | | 1060G87 | 2005-10-08 04:11:33.0 | 2005-10-08 04:26:54.0 | 25 | 27 | 38 | 27 | 9 | 32 | 5 | 97.71 |
| WPPHC5#1 | WC8945.00 | 1 | 16.58 | 1.86 | K051155A | | 1060GG7 | 2005-10-08 04:28:46.0 | 2005-10-08 04:45:21.0 | 25 | 34 | 51 | 31 | 5 | 6 | 3 | 90.45 |
| WPPHC5#1 | WC9138.00 | 1 | 14.95 | 1.10 | L472197A | | 1060 | | | 25 | 28 | 40 | 28 | 7 | 30 | 6 | 100.33 |
| WPPHC5#1 | WC8964.00 | 1 | 6.41 | 1.63 | K051155A | | 1060 | IF AVG. | | 9 | 35 | 47 | 34 | 8 | 25 | 5 | 84.15 |
| WPPHC5#1 | WC8964.00 | 0 | 10.50 | 0.08 | K051155A | | 0060 | EXP_TIME < 30s, | | 16 | 34 | 35 | 34 | 5 | 6 | 5 | 91.42 |
| WPPHC5#1 | WC9136.00 | 0 | 14.75 | 1.06 | L472197A | | 1060 | TRACK BECOMES | | 25 | 28 | 41 | 24 | 7 | 30 | 5 | 101.69 |
| WPPHC5#1 | WC8951.00 | 0 | 16.65 | 1.63 | K051155A | | 1060 | A BOTTLENECK | | 25 | 34 | 47 | 30 | 5 | 6 | 0 | 90.09 |
| WPPHC5#1 | WC9322.00 | 0 | 4.71 | 1.10 | K371197A | | 1060 | | | 8 | 30 | 41 | 29 | 5 | 6 | 5 | 101.76 |

Ⓖ

Photo Tool Wafer Process Summary

| Total Changes Ⓐ | Total Operations Ⓑ | Query Duration (min) Ⓒ | Total Process Time (min) Ⓓ | Total Time (min) Ⓔ | Moves Ⓕ | Avg WPH |
|---|---|---|---|---|---|---|
| 15 | 21 | 360 | 320.17 | 36.55 | 483 | 91.40 |

FIG. 4

| RETICLE_ID | DATA | TOOL_ID | | | | |
|---|---|---|---|---|---|---|
| | | WPPHC2#1 | WPPHC3#1 | WPPHC4#1 | WPPHC5#1 | WPPHE4#1 |
| L472197A | AVERAGE OF WPH | 88 | 100 | 97 | 100 | 88 |
| | AVERAGE OF P_TIME | 17 | 15 | 15 | 15 | 17 |
| | AVERAGE OF AVG_P | 28 | 28 | 28 | 28 | 26 |
| | AVERAGE OF AVG_T | 13 | 7 | 9 | 7 | 15 |
| | SUM OF BATCH | 9 | 1 | 5 | 14 | 9 |
| L472198A | AVERAGE OF WPH | 90 | 101 | 100 | 100 | 89 |
| | AVERAGE OF P_TIME | 17 | 15 | 15 | 15 | 17 |
| | AVERAGE OF AVG_P | 28 | 27 | 28 | 28 | 26 |
| | AVERAGE OF AVG_T | 12 | 8 | 8 | 8 | 14 |
| | SUM OF BATCH | 3 | 22 | 3 | 2 | 2 |

FIG. 5

| RETICLE_ID | DATA | TOOL_ID | | | | | |
|---|---|---|---|---|---|---|---|
| | | D0 | D4 | D5 | E1 | E3 | |
| L | AVERAGE OF WPH | 92 | 85 | 92 | 93 | 95 | |
| | AVERAGE OF AVG_P | 29 | 33 | 31 | 29 | 26 | |
| | AVERAGE OF AVG_T | 10 | 8 | 8 | 9 | 11 | |
| | AVERAGE OF ENERGY | 49 | 49 | 49 | 48 | 47 | |
| K | AVERAGE OF WPH | 72 | 67 | 72 | 73 | 73 | |
| | AVERAGE OF AVG_P | 42 | 48 | 43 | 42 | 42 | |
| | AVERAGE OF AVG_T | 8 | 6 | 7 | 7 | 6 | |
| | AVERAGE OF ENERGY | 41 | 39 | 40 | 39 | 39 | |

FIG. 6

| ILSC | TOTAL RETICLE CHANGES | TOTAL LOT OPERATIONS | QUERY DURATION (MIN) | TOTAL PROCESS TIME (MIN) | TOTAL LOST TIME (MIN) | TOTAL MOVES | AVG WPH |
|---|---|---|---|---|---|---|---|
| C2 | 38 | 63 | 1440 | 1231 | 182 | 1534 | 76 |
| C3 | 59 | 76 | 1440 | 1200 | 200 | 1862 | 94 |
| C4 | 54 | 75 | 1440 | 1231 | 195 | 1751 | 88 |
| C5 | 45 | 63 | 1440 | 1246 | 138 | 1520 | 76 |
| E4 | 30 | 48 | 1440 | 1000 | 387 | 1157 | 74 |
| AVG. | 45 | 65 | 1440 | 1182 | 220 | 1565 | 82 |

IDEAL LOST TIME IS LESS THAN 100

FIG. 7

| TRACK UNIT → | C2 | C3 | C4 | C5 | E4 | | ADH | CPL | COT | SB | CPL | WEE | PEB | CPL | DEV | HB | CPL |
|---|---|---|---|---|---|---|---|---|---|---|---|---|---|---|---|---|---|
| RECIPE_ID | | | | | | | ADH | CPL | COT | SB | CPL | WEE | PEB | CPL | DEV | HB | CPL |
| 060G87 | | | | | | C3/C4/C5 | 2 | 1 | 2 | 3 | 1 | 1 | 4 | 2 | 4 | 120:+110:3 | 1 |
| NT15 | | | | | | C2 | 2 | 2 | 2 | 3 | 4 | 1 | 3 | 2 | 3 | 3 | 2 |
| LDD | | | | | | E4 | 2 | 2 | 2 | 6 | 4 | 1 | 6 | 3 | 3 | 120:3 110:3 | 1 |
| | | | | | | | ADH | CPL | COT | SB | CPL | WEE | PEB | CPL | DEV | HB | CPL |
| | Avg. WPH | 84 | 97 | 95 | 94 | 77 | RECIPE | ADH1 | CPL1 | COT1 | SB1 | CPL2 | WEE1 | PEB1 | CPL3 | DEV1 | HB1 | CPL4 |
| | Avg. AVG_P | 30 | 29 | 31 | 29 | 27 | P_time | 45.0 | 30.0 | 48.3 | 90.0 | 30.0 | 25.0 | 100.0 | 30.0 | 123.7 | 90.0 | 15.0 |
| | Avg. AVG_T | 13 | 8 | 7 | 9 | 20 | C3/C4/C5 U_time | 22.5 | 15.0 | 24.2 | 30.0 | 30.0 | 25.0 | 25.0 | 15.0 | 30.9 | 22.5 | 15.0 |
| | Avg. ENERGY | 224 | 227 | 224 | 226 | 220 | C2 U_time | 22.5 | 15.0 | 24.2 | 30.0 | 30.0 | 25.0 | 33.3 | 15.0 | 41.2 | 30.0 | 7.5 |
| | Total BATCH | 63 | 89 | 56 | 50 | 2 | E4 U_time | 22.5 | 15.0 | 24.2 | 15.0 | 7.5 | 25.0 | 19.5 | 10.0 | 41.2 | 30.0 | 15.0 |
| 060G7 | | | | | | | RECIPE | ADH2 | CPL5 | COT2 | SB2 | CPL6 | PASS | PEB2 | CPL7 | DEV2 | HB2 | CPL8 |
| NT15 | Avg. WPH | 83 | 88 | 91 | 88 | | P_time | 45.0 | 30.0 | 48.3 | 90.0 | 30.0 | 0.0 | 100.0 | 30.0 | 123.7 | 90.0 | 15.0 |
| RPO | Avg. AVG_P | 34 | 33 | 33 | 33 | | C3/C4/C5 U_time | 22.5 | 15.0 | 24.2 | 30.0 | 30.0 | 0.0 | 25.0 | 15.0 | 30.9 | 22.5 | 15.0 |
| | Avg. AVG_T | 10 | 7 | 6 | 7 | | C2 U_time | 22.5 | 15.0 | 24.2 | 30.0 | 30.0 | 0.0 | 33.3 | 15.0 | 41.2 | 30.0 | 7.5 |
| | Avg. ENERGY | 253 | 250 | 248 | 255 | | E4 U_time | 22.5 | 15.0 | 24.2 | 15.0 | 7.5 | 0.0 | 19.5 | 10.0 | 41.2 | 30.0 | 15.0 |
| | Total BATCH | 13 | 18 | 11 | 3 | | | | | | | | | | | | | |

FIG. 8

Origination:
Report Owner

Username : mliu  Log Out

Tool to Tool WPH Comparison with Same Reticle

Start From: [ ] -To: [ ]

Reticle ID: [K803120A]  Separated by space ~32

Order By: ⊙ Reticle ID  ○ Tool ID

[Query]

Date From: 2006-07-01 06:00:00 To: 2006-07-20 06:00:00

| Row | RETICLE_ID | RECIPE_ID | TOOL_ID | WPHP_Time(Lot) | P_Time(Wafer) | Xfer(Wafer) | SUM_BATCH |
|---|---|---|---|---|---|---|---|
| 1 | K803120A | M5FYRX | WPPHD4#1 | 81.74 18.43 | 35.22 | 8.55 | 1.00 |
| 2 | K803120A | M5FYRX | WPPHD5#1 | 76.81 19.50 | 39.53 | 6.71 | 1.00 |
| 3 | K803120A | M5FYRX | WPPHE1#1 | 77.09 18.74 | 37.76 | 10.61 | 1.00 |
| 4 | K803120A | M5FYRX | WPPHE3#1 | 92.54 16.20 | 32.50 | 6.00 | 1.00 |

DATA ~84

80

METHOD AND SOFTWARE FOR CONDUCTING EFFICIENT LITHOGRAPHY WPH / LOST TIME ANALYSIS IN SEMICONDUCTOR MANUFACTURING

FIELD OF THE INVENTION

The present invention relates, most generally, to data analysis software and methods for manufacturing semiconductor devices. More particularly, the present invention is related to a method and software for analyzing processing and transport times associated with lithography operations in semiconductor manufacturing, and for querying a database to produce comparative time data that reveals bottlenecks in such lithography operations.

BACKGROUND

Semiconductor device manufacturing involves a lengthy fabrication process that includes multiple patterning operations. Each of the patterning operations utilizes a photolithographic process sequence. The photolithographic process sequence involves coating a wafer with a photosensitive material such as photoresist, then forming a pattern in the photosensitive material. The pattern is formed in the photosensitive material by first exposing the photosensitive material to light that has been directed through a photomask which has an opaque pattern, then developing the photosensitive material to remove the exposed or unexposed portion of the film, depending on whether positive or negative photosensitive material is used. Such a pattern is found at several device levels in the manufacture of a semiconductor device.

These operations are carried out along with several other operations in an integrated lithography tool that typically includes a stepper or scanner within which the exposure operation is carried out, and a track that includes multiple units that perform the previously discussed develop and coat operations as well as hard bake operations, soft bake operations, cooling operations, adhesion enhancement operations, post-exposure bake operations and requisite wafer transfer operations between the stations. There are therefore processing times associated with each of the aforementioned unit operations including wafer-to-wafer transfer times between the unit operations. Moreover, the time required to process an entire lot through a unit operation is influenced by the number of units used to carry out the operation. For example, in a single lithography tool, there may be multiple coating operations, multiple hard bake stations, multiple developer heads, and so forth. When a lot of semiconductor wafers has completed processing at the lithography operation, and a new lot is poised to be processed at the lithography tool, the recticle or photomask must be changed. As such, there are also lot-to-lot set up transfer times to consider.

High volume semiconductor manufacturing facilities typically have several of the aforementioned lithography tools and each of the lithography tools may be used to carry out patterning operations at various different levels for various different technologies and device types. Many process recipes may be used to carry out the patterning operations using the various unit operations described above, and the recipes typically vary by device level. Moreover, the number of unit operations may be different for the various lithography tools in a production facility.

In today's rapidly advancing semiconductor manufacturing industry, the time required to process a semiconductor wafer at any stage such as the patterning operations, is critically important. A reduction in processing time at any particular processing operation produces an increased WPH (wafers per hour) output for the processing tool and this increased manufacturing tool output improves the efficiency of the tool producing a cost savings. Each processing tool such as a lithography tool may typically include an inherently time limiting operation such as the alignment and exposure operation in a lithography tool. It would be inefficient and cost ineffective to have an overall lithography operation limited by a different operation, for example a baking operation that requires more time than the exposure operation due to an insufficient number of bake plates or other process inefficiencies associated with the baking operation. Such would be a bottleneck that hinders overall progress at the lithography operation.

It is therefore critically important to quickly identify bottlenecks in lithography operations. Moreover, it would be advantageous to specify one fabrication parameter such as lithography tool or technology type, device type, device level, or reticle and to be able to quickly compare processing times between other of the fabrication parameters.

SUMMARY OF THE INVENTION

To address these and other needs and in view of its purposes, the present invention provides a method for comparing lithography processing time data in semiconductor device manufacturing. The method includes obtaining wafer time log data from each of a plurality of lithography tools, parsing the wafer time log data and providing the wafer time log data to a database. The method also includes querying the database by specifying at least one fixed fabrication parameter of a plurality of fabrication parameters, classifying the wafer time log data according to other of the fabrication parameters and responsive to the querying, and generating a data display that identifies at least one lithography operation bottleneck by comparing operation time data between at least one other of the fabrication parameters. The operation time data includes wafer processing and wafer transport times.

According to another aspect, the present invention provides a method for identifying lithography operation bottlenecks in semiconductor device manufacturing. The method includes obtaining wafer time log data from at least one lithography tool, parsing the wafer time log data and providing the wafer time log data to a database. The method also includes querying the database by specifying at least one fixed fabrication parameter of a plurality of fabrication parameters and classifying the wafer time log data according to other of the fabrication parameters and responsive to the querying. The method further includes identifying at least one lithography operation bottleneck by generating a data display based on the wafer time log data in the database that identifies at least one of the lithography operation bottlenecks by comparing operation time data between the other fabrication parameters. The operation time data includes average wafer processing times and average wafer transport times. The wafer time log data includes processing and transport times for individual components of each lithography tool, the individual components including wafer coater, cooling plates, developer heads, hard bake units, soft bake units, post exposure bake units, exposure operation and adhesion treatment.

According to another aspect, the invention provides a computer readable medium with encoded instructions for performing a method for identifying lithography operation bottlenecks in semiconductor device manufacturing. The method may be one of the aforementioned exemplary methods.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 2 is an exemplary interface screen for querying the database according to the invention;

FIG. 3 is an exemplary comparative WPH data display produced according to the invention;

FIG. 4 is another exemplary comparative WPH data display produced according to the invention;

FIG. 5 is yet another exemplary comparative WPH data display produced according to the invention;

FIG. 6 is still another exemplary comparative WPH data display produced according to the invention;

FIG. 7 is another exemplary comparative WPH data display produced according to the invention;

FIG. 8 shows an exemplary interface screen with querying data and a comparative WPH data chart produced in response the querying;

DETAILED DESCRIPTION

The invention provides a versatile diagnostic tool including a system, software and a method for obtaining wafer time log data such as times observed, measured or recorded at semiconductor processing operations including process time and transfer time, and also programmed times for the various process recipes used in photolithographic processing operations. Such wafer time log data is recorded for multiple lithographic tools in a fabrication area, multiple technologies, multiple device types, multiple recipes, and at multiple device levels. This data covers multiple lots. A lot is a group of wafers that are transported and processed together through a fabrication area. The wafer time log data is also obtained for processing sub-units, that is individual processing operations carried out in conjunction with the lithography process, such as various bakes, coat operations, develop operations, and so forth. The data is compiled into a database and classified according to data type. A user queries the database by specifying at least one parameter and in response to the querying, the data is correlated, reorganized and classified and a diagnostic display is provided. The diagnostic display presents operation time data comparing various processing operations, fabrication parameters and units. Such comparative data displays may identify a bottleneck in the system. A bottleneck is used in its ordinary meaning and may be considered a delay in progress caused when one part of the operation or activity is slower than the others and so hinders overall progress. The operation time data may be provided in tabular or chart form and may express the time data in WPH (wafers per hour) or in other suitable time units.

Based on the identified lithography operation bottleneck or bottlenecks, one or more changes may then be instituted in one or more processing operations of the semiconductor device manufacturing operation. For example, a processing tool may be examined and a mechanical, programming or other adjustment may be made to upgrade or correct a problem in the processing tool. The processing tool may be a lithography or other manufacturing tool. Engineering changes may be instituted to improve the performance of a tool or a component thereof. The capacity of a tool may be increased. An additional tool may be obtained and/or qualified for use for a particular operation or to run a particular recipe. The product mix running through a particular tool may be altered to reduce backlog, e. g., if a bottleneck occurs while running a high volume of product 1 that requires step x, in tool a, product starts may be altered to include more product 2, that does not require step x, or does not require tool a. The foregoing examples are intended to illustrate and not limit the changes that may be made responsive to the identified bottlenecks.

Figure 1:
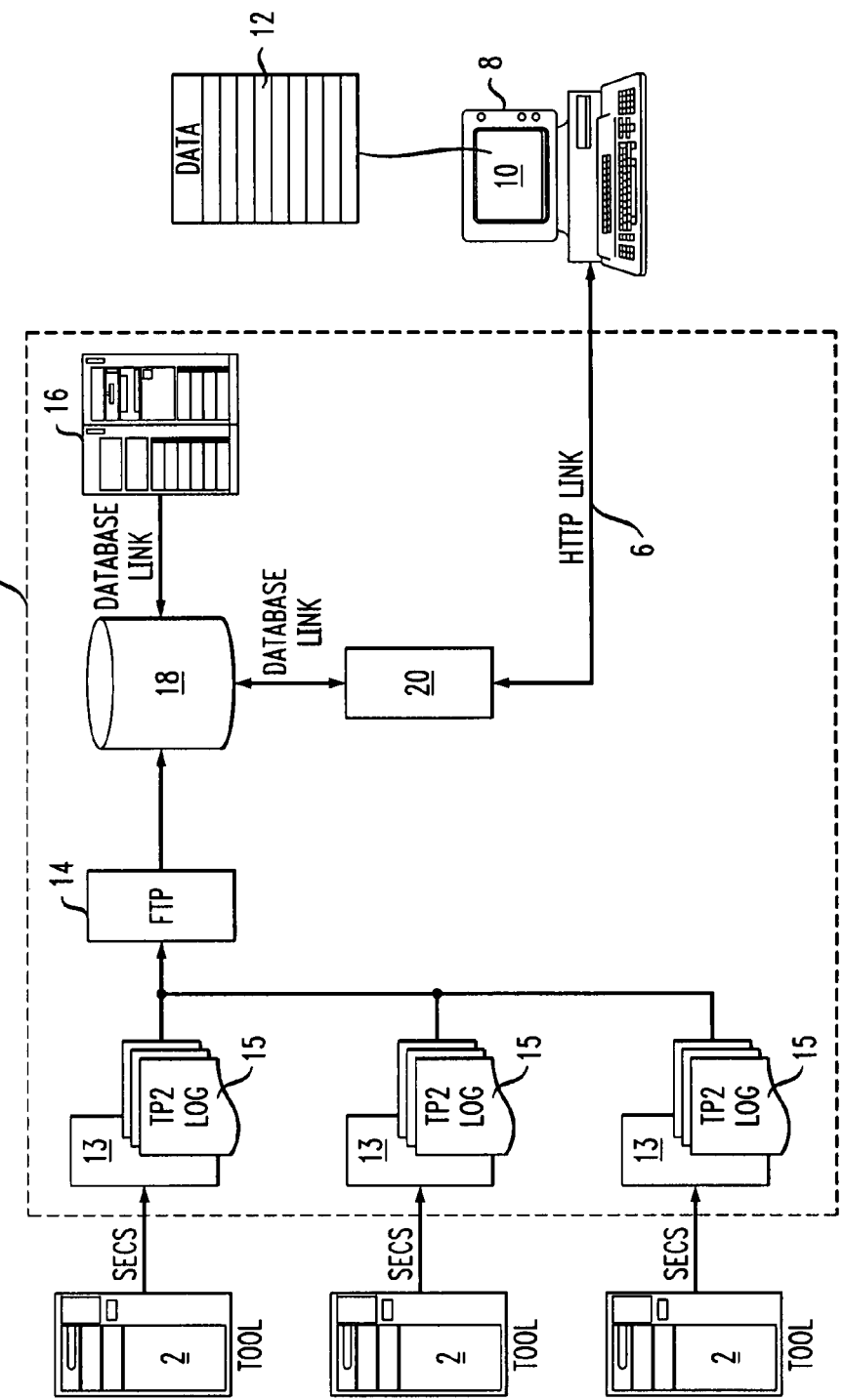
FIG. 1 is a schematic diagram showing an exemplary system of the invention.

FIG. 1 is a schematic diagram that shows lithography tools 2 providing information to computer system 4 which communicates via link 6 with interface unit 8 which includes display screen 10. Link 6 may be an HTTP link. Display screen 10 illustrates data 12 in tables, charts or other forms as will be shown in further detail in subsequent figures. Computer system 4, in an exemplary embodiment, includes IPC's (Industrial PC's) 13, TP2 server 14, MES host 16, MES database 18 and report server 20. Report server 20 is coupled directly to interface unit 8 via link 6. Computer system 4 is not intended to be limited to the illustrated exemplary arrangement and may include other components and other arrangements, in other exemplary embodiments.

Lithography tools 2 may be any suitable lithography tools used in semiconductor manufacturing, in particular, lithography tools 2 may be any of various steppers or scanners, such as may be manufactured by ASML of Velvhoven, the Netherlands or other suitable manufacturers. Various other lithography tools such as ILSC (I-line scanners), DUV scanners and other suitable tools may be used in other exemplary embodiments. Lithography tools 2 are each electronically coupled to computer system 4 to enable communication therebetween. Although the illustrated embodiment shows three (3) such lithography tools 2, the system may accommodate any number of lithography tools 2 coupled to computer system 4. Each lithography tool 2 includes an exposure area in which a wafer is exposed, and lithography tool 2 also includes a plurality of sub-units and transport units that transport the wafers to and between the sub-units according to a process recipe that may be programmed into lithography tool 2. The sub-units or individual components of lithography tool 2 may include one or more cooling plates, one or more photoresist coaters, one or more develop stations, one or more hard bake stations, one or more soft bake stations, one or more post exposure bake stations, and one or more adhesion enhancement stations, such as may be used to coat wafers with HMDS (hexamethyldisilizane). The number of sub-units or individual components of the lithography tool may vary. For example, the three illustrated lithography tools 2 may include different numbers of one or more of the aforementioned sub-units or individual components.

A wafer will be loaded into the transport system of lithography tool 2 and, according to a process recipe, will be processed through one or more of the aforementioned sub-units and in various sequences also prescribed by the recipe. The time and conditions for processing at each of the sub-units is prescribed by the associated recipe. Various different device types, various different process technologies and various different process levels or reticle levels, may be processed in each lithography tool 2 using various recipes. The wafer time log data that is provided to computer system 4 includes programmed times for each operation that takes place in each of the sub-units or individual components such as provided on a recipe. The wafer time log data provided to computer system 4 also includes observed and recorded times for processing wafers in processing operations that are not time-programmed, such as exposure operations which are programmed for exposure amount and for which time is a dependent variable. The wafer time log data provided to computer system 4 also includes times for transporting wafers. Transport times include wafer-to-wafer transfer times at a particular sub-unit, station-to-station transfer times and lot-to-lot set up and transfer times.

Still referring to FIG. 1, TP2 server 14 is a tool performance tracking platform coupled to IPC's 13 which, in turn, are coupled to tools such as lithography tools 2 with an SECS (Semiconductor Equipment Communication Standard) interface. IPC's 13 utilize TAP, tool application programming, and include programs that obtain, store and maintain tool event data, i.e. wafer time log data, as raw data files. IPC's 13 are commercially available and may utilize an MS windows 2000 or other suitable operating system. The raw data is saved as flat text files which are illustrated as TP2 log files 15. The log files may include information such as wafer, tool and chamber in/out time, status, and the like. IPC's 13 may be programmed using C/C++ programming language but other suitable programming languages may be used in other exemplary embodiments.

TP2 server 14 is programmed with code that causes TP2 server 1 to obtain and parse TP2 wafer data log file information from the raw data files of TP2 log files 15 at IPC's 13. TP2 server 14 may include an NT server platform with SECS interface. The development program used may be Delphi 5.0, but other suitable development programs may be used. In one exemplary embodiment, the TP2 server 14 may be an Intel-based PC with an MS Windows 2003 operating system but other systems may be used in other exemplary embodiments. TP2 server 14 may be an NT Server 2003 but other suitable servers may be used in other exemplary embodiments. Such parsed wafer operation information is extracted and stored in MES database 18 which includes all MES (Manufacturing Execution Systems) data and TP2 data. IBM DB2/UDB v7.2 software may be used in one exemplary embodiment but other software products may be used in other exemplary embodiments. MES host 16 extracts the TP2 data from relational MES database 18, processes the data, summarizes the data and returns the data to MES database 18. MES host 16 may be programmed using java, C/C++, SQL or other suitable programming languages. MES database 18 data is obtained by report server 20 which processes the database data.

Figure 9:
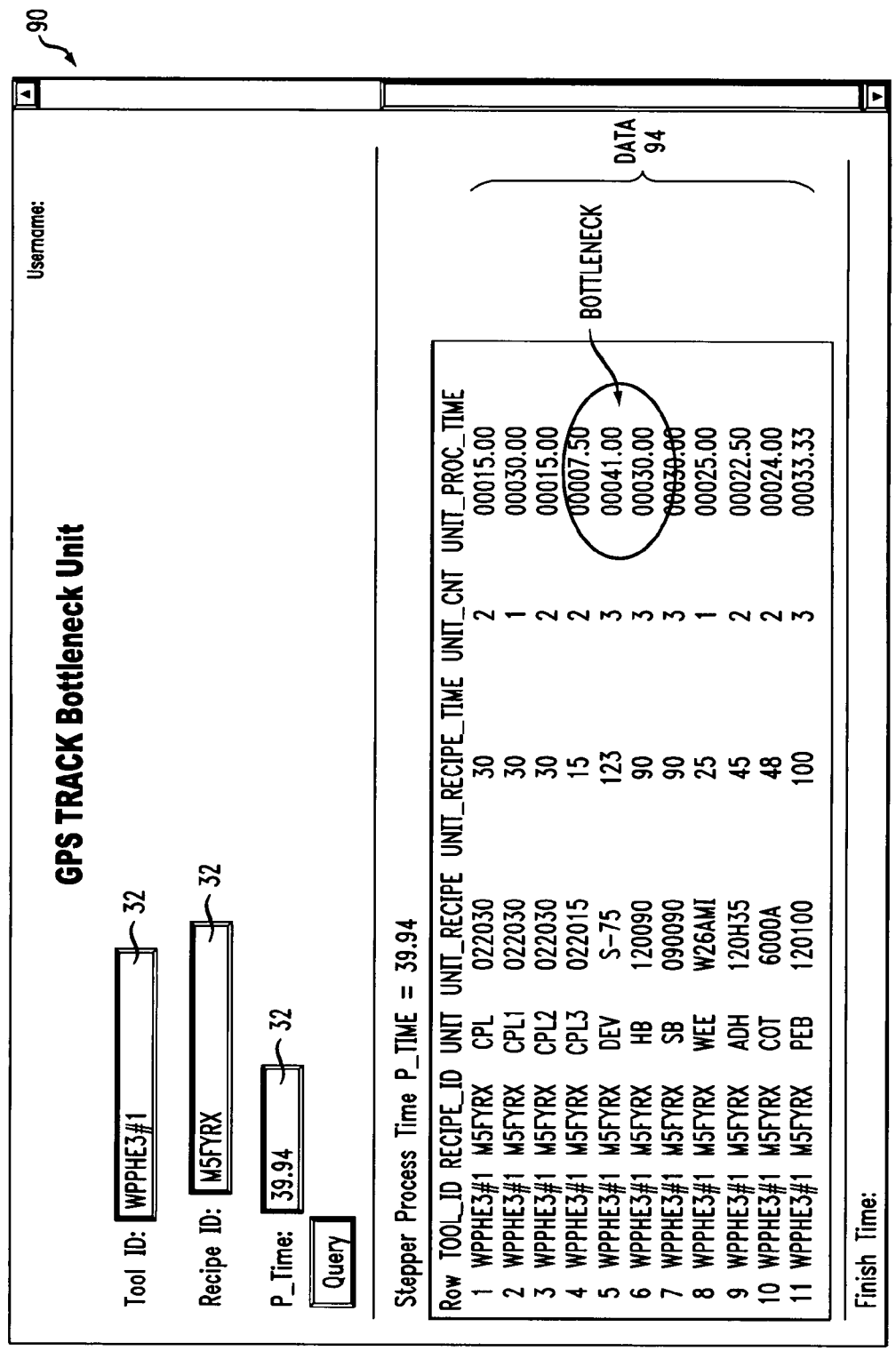
FIG. 9 shows an exemplary interface screen with querying data and a comparative WPH data chart produced in response the querying.

Report server 20 is a J2EE application server running as a presentation system. Report server 20 obtains the query input and serves the interface unit 8. In one exemplary embodiment, a J2EE application server may use a BEA Web Logic version 81 software. The J2EE application server provides a user interface at user interface unit 8 such as is shown in FIGS. 2, 8 and 9. Report server 20 receives user input from interface unit 8 such as user/password, query criteria and so forth. Report server 20 processes the input criteria and obtains related data from MES database 18 and provides a table, chart, report or other data presentation via interface unit 8. The tables, charts, etc. may identify bottlenecks by displaying WPH, various process times, and the like. Report server 20 provides a graphical, tabular or other data reports that may be displayed on display screen 10. In one exemplary embodiment, report server 20 may be an Intel CPU based PC with a Microsoft MT server but other suitable systems may be used in other exemplary embodiments. Report server 20 therefore correlates the data, reorganizes the data as necessary, and classifies the data responsive to queries received from interface unit 8 via link 6. Access to and programming of report server 20 may require user authentication and authorization.

Computer system 4 performs operations for obtaining, correlating, classifying, i.e. arranging or ordering by class or category, comparing and presenting the data. Another aspect of the invention is a computer program product with encoded instructions for performing operations for managing data in a database, in particular identifying lithography processing bottlenecks in semiconductor device manufacturing. The computer readable medium is encoded with computer program code, wherein, when the computer program code is executed by a computer processor in computer system 4, the processor formed of the platforms of IPCs 13, TP2 server 14, MES host 16 and Report Server 20 performs a method for obtaining, correlating, classifying, comparing and presenting data and for identifying lithography processing bottlenecks in semiconductor device manufacturing. The method includes the steps of obtaining wafer time log data from multiple lithography tools and providing the wafer time log data to a database such as MES database 18. Computer system 4 then correlates the wafer time log data as described previously. Computer system 4 receives a query of the database via HTTP link 6 and interface 8. The query specifies and fixes at least one fabrication parameter. The wafer time log data is classified by MES host 16 which pre-summarizes the data according to other fabrication parameters and responsive to the querying. Report server 20 then generates a WPH (wafer per hour) data presentation that identifies at one lithography processing bottleneck by comparing operation time data between the other fabrication parameters. The operation time data includes wafer processing times and wafer transport times.

A user queries MES database 18 using interface unit 8 to obtain a display of data 12 that may be displayed on display screen 10 and which compares aspects of the lithography operations and identifies bottlenecks. An exemplary interface screen will be shown in FIG. 2 and in subsequent figures. Using interface unit 8, the user may specify one or more processing or fabrication parameters to be fixed. Fabrication parameters may include particular photolithography tool 2, device type, recipe, device level, lot number technology type, and the like. The aforementioned fabrication parameters are exemplary only and other common or unique fabrication parameters may be used in other exemplary embodiments. In one exemplary embodiment, only the particular lithography tool may be specified and in another exemplary embodiment, both a particular processing tool 2 and one of device type, recipe, device level, and technology type may further be specified. In another exemplary embodiment, each of the aforementioned fabrication parameters may be specified and the transfer and processing times for operations that take place at the sub-units may be analyzed. With one or more fabrication parameters specified, the invention provides for comparing data of the database, for other of the fabrication parameters. For example, for a specified lithography tool and mask level, the invention may identify a particular sub-unit or individual component that represents the bottleneck. In another exemplary embodiment, only a particular recipe may be specified and a particular lithography tool 2 may be identified as the bottleneck. Various other exemplary embodiments follow.

Data 12 may be presented in various forms such as tables, charts and graphs and may be used to illustrate comparisons between process parameters with one or more other process parameters fixed. For example, a process recipe and particular device type may be selected and fixed, and the data display will illustrate comparisons in processing and transfer time, between different processing tools 2. User interface unit 8 may provide, responsive to a user's query, a photolithography wafer WPH report, a photolithography wafer WPH detail report, a tool-to-tool WPH comparison for one particular reticle, a tool-to-tool key indices comparison for an ILSC, I-line Scanner, or other lithography tools, a tool operation history report with photolithography WPH, a track bottleneck unit for a GPS or other transport method, and other similar reports displayed variously.

FIG. 2 is an exemplary portion of an interface screen 30 that may appear on display screen 10 and includes data entry ports 32 into which various fabrication parameters and other processing-related parameters may be entered. In FIG. 2, the time period to be analyzed may be entered into the appropriate data entry ports. A lot ID such as lot number may be the fabrication parameter entered into the corresponding data entry port 32 if such is to be specified. A lithography tool ID may similarly be entered into the indicated data entry port 32, if so desired and a reticle ID, if such is to be specified, may similarly be entered into the indicated data entry port 32. It is to be understood that interface screen 30 is exemplary only and in other exemplary embodiments, the interface screen may include more or fewer data entry ports arranged in a different manner and into which various other process parameters may be entered.

FIG. 3 is an exemplary WPH report 40 with the lithography tool WPPHC5#1 representing the fabrication parameter specified, i.e. fixed, and shows operation time data for various identified lots (LOT_ID) processed through lithography tool WPPHC5#1 using various (RETICLE_ID) and recipes (RECIPE_ID). The operation time data includes processing time (P_TIME), lost time, processing (P) average, maximum, and minimum times and transfer (T) average, maximum, and minimum times, as well as WPH. The duration, i.e. time period analyzed, is specified as illustrated. The data presentation illustrated in FIG. 3 identifies as a bottleneck a lost time incident that is too great in duration, i.e. "lost time too long" as well as two lots that include a processing time that exceeds 17 minutes and which also represents a bottleneck. FIG. 3 also illustrates incidents in which AVG_T, average transfer time, represents an alarmingly high percentage of the average processing time, AVG_P, exposure time average for each of the wafers.

FIG. 4 illustrates in the form of another exemplary WPH report table 44, which is a WPH report showing tool-to-tool WPH comparison with the same reticle, for each of reticles L472197A and L472198A. For each reticle, the following parameters are shown for each of five (5) different lithography tools: average of WPH; average of P_TIME (processing time); average of AVG_P (average processing time); average of $AVG_{13}$ T (wafer-to-wafer transfer time); and sum of BATCH—the number of lots run with these particulars. Table 44 indicates that tool WPPHE4#1 has the fastest exposure time and that tools WPPHC2#1 and WPPHE4#1 have the longest transfer times and these track delays represent bottlenecks. Responsive to the identified bottleneck, changes can then be instituted in the semiconductor device manufacturing operation such as in the tracks for tools WPPHC2#1 and WPPHE4#1.

Table 50 of FIG. 5 shows, for each of reticles L and K, comparative operation time and WPH data for five different lithography tools D0, D4, D5, E1 and E3. In this example, the reticle L or K is specified, i.e., a fixed fabrication parameter, and comparative data is shown for five lithography tools. The data in table 50 indicates that for a prescribed reticle and the same process recipe, lithography tool D4 has the longest exposure time for similar energy produced and is a bottleneck. E3 has the fastest exposure time. The bottleneck in using lithography tool D4 would lead an analyst to consider aspects that cause the average processing AVG_P time in D4 to exceed that in the other tools. An analyst may conclude that the laser frequency calibration is incorrect for the exposure tool D4.

FIG. 6 is another exemplary advanced WPH data presentation achievable using the software and method of the invention. In particular, various operation time data is presented for I-line Scanner tools C2, C3, C4, C5 and E4. Table 60 provides a tool-to-tool key index comparison for multiple process tools. Table 60 indicates that tool E4 has the highest lost time, significantly greater than the lost time for the other four tools. An analyst is thus directed to troubleshoot E4. The bottleneck of the greatest lost time at tool E4 is identified and automatically highlighted in the data display.

FIG. 7 is another exemplary embodiment of an advanced WPH report in tabular form, according to the invention. On the left hand side, table 70 shows, with two process recipes being the fixed fabrication parameters, average WPH, average process time, average transport time, and average energy for five lithography tools, C2, C3, C4, C5, and E4. The average process time and average transport time are operation time data. Table 70 also shows, on the right hand side, average processing times at individual processing units with lithography tools C3, C4, and C5 grouped together because they have the same number of sub-stations, that is, adhesion stations (ADH), cold plates (CPL), coaters (COT), soft bake stations (SB), wafer edge removal stations (WEE), post exposure bake stations (PEB), post exposure cold plate (CPL), developer stations (DEV), hard bake stations (HB) and final cooling plates (CPL). Unit process times are indicated by U_time and table 70 illustrates bottlenecks 72 indicating that, for each recipe, photolithography tool C2 has the slowest unit processing time for the post exposure bake stations and developer stations and photolithography E4 has the slowest unit time for the develop stations. Bottlenecks 72 identified and automatically highlighted in the data display. Corrective action in the lithography process can then be taken responsive to the identified bottlenecks and as described above.

FIGS. 8 and 9 illustrate display screens 80 and 90 that each include a data display displaying pertinent timing information on the same screen as includes data entry ports 32 and which together may form an exemplary display screen 10 of interface 8. FIG. 8 includes data entry port 32 for receiving reticle ID to be specified and provides comparative timing data 84 between different tools for the same reticle K803120A and recipe M5FYRX. T_Time(Wafer) indicates time in seconds for processing each wafer and Xfer(Wafer) indicates wafer-to-wafer transfer time. FIG. 9 is an interface screen 90 with data entry ports 32 used to receive fabrication parameters, i.e., specify a particular tool and recipe and which provides data 94 comparing unit processing times (UNIT_PROC_TIME) for the various sub-units that are used in conjunction with a lithography operation. Data 94 is useful in indicating bottlenecks on one lithography tool 2 such as may be specified by inputting the particular tool identifier into the appropriate data entry port 32. Data 94 includes programmed times and provides data for each of the sub-units used in the process indicated by the recipe and chosen lithography tool 2. Data 94 indicates that for the indicated tool and recipe, the time-limiting sub-unit that creates a bottleneck is at the develop (DEV) sub-unit because the program time of 123 seconds, together with only three units available on the track, provides a unit process time of 41 seconds which represents the bottleneck. Although display screen 90 includes data 94 representing a process recipe with 11 operations, it should be understood that such is exemplary only and other process recipes may include a greater or fewer number of individual sub-units.

Figure 10:
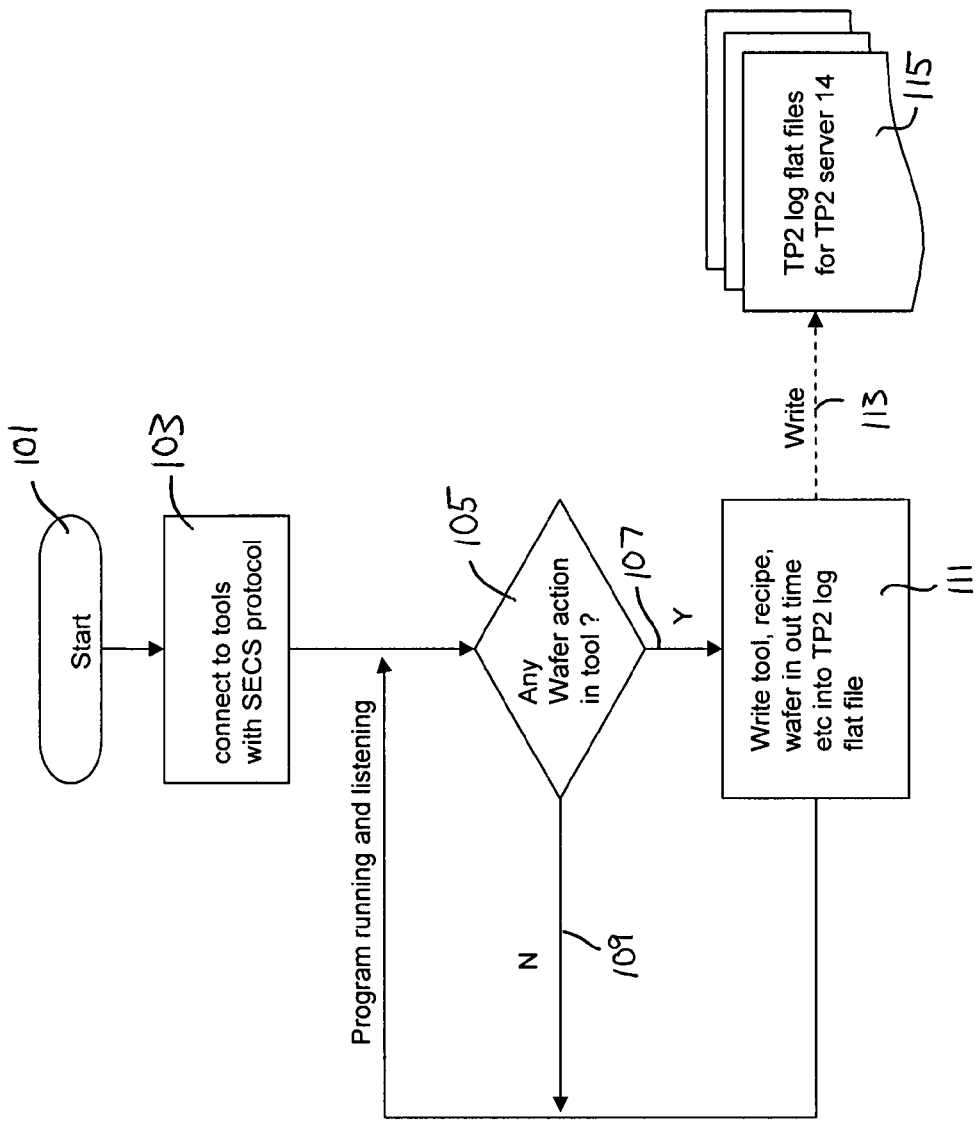
FIG. 10 is a flow chart of the data manipulation that takes place at IPC's.

FIG. 10 is a flow chart of the data manipulation that takes place at IPC's 13. The process starts at step 101. Connection to tools with SECS protocol occurs at step 103. At step 105, the system queries: Any Wafer action in tool? If yes 107, tool, recipe, wafer in/out time etc. is written into TP2 log file 15 at step 111. If no 109, the program returns to step 105. TP2 log files 15 are written to TP2 server 14 at step 115.

Figure 11:
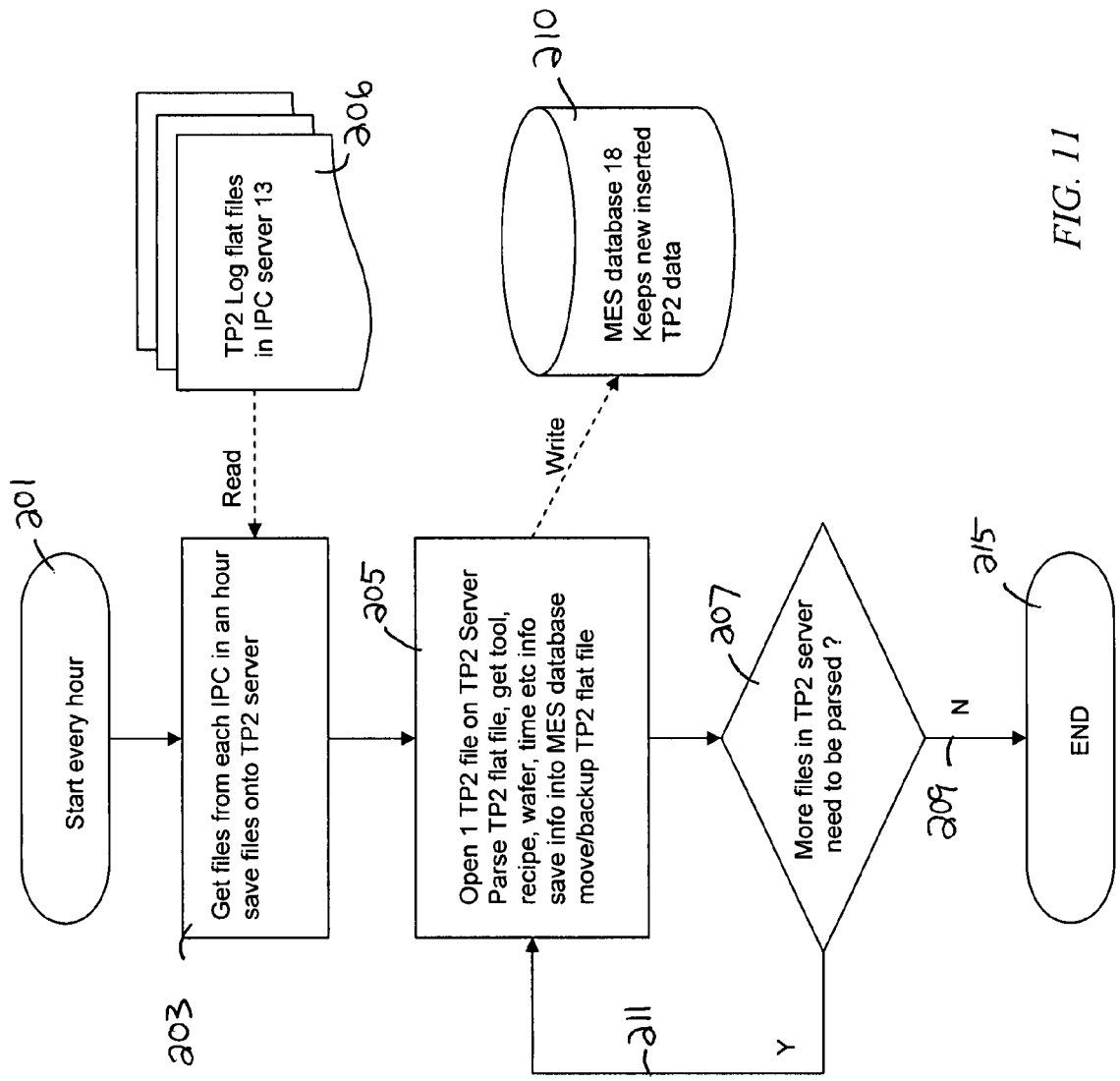
FIG. 11 is a flow chart of the data manipulation that takes place at the TP2 server.

FIG. 11 is a flow chart of the data manipulation that takes place at TP2 server 14. The process starts at step 201. At step 203, files are obtained from each IPC 13 hourly and saved onto TP2 server 14. This hourly frequency is exemplary only. At step 205, TP2 log file 15 is opened on TP2 server 14. The data is parsed as a TP2 flat file, i.e. TP2 log file 15. Tool, recipe, wafer, time etc info is obtained and saved into MES database 18 as a backup to TP2 log file 15. At step, 206 TP2 log files 15 are read 208 from IPC's 13. At step 207 it is determined if more files in TP2 server 14 need to be parsed. If yes 211, the process returns to step 205. If no, the process continues to step 215 end. Write operation 213 writes data to MES database 18 at step 210.

Figure 12:
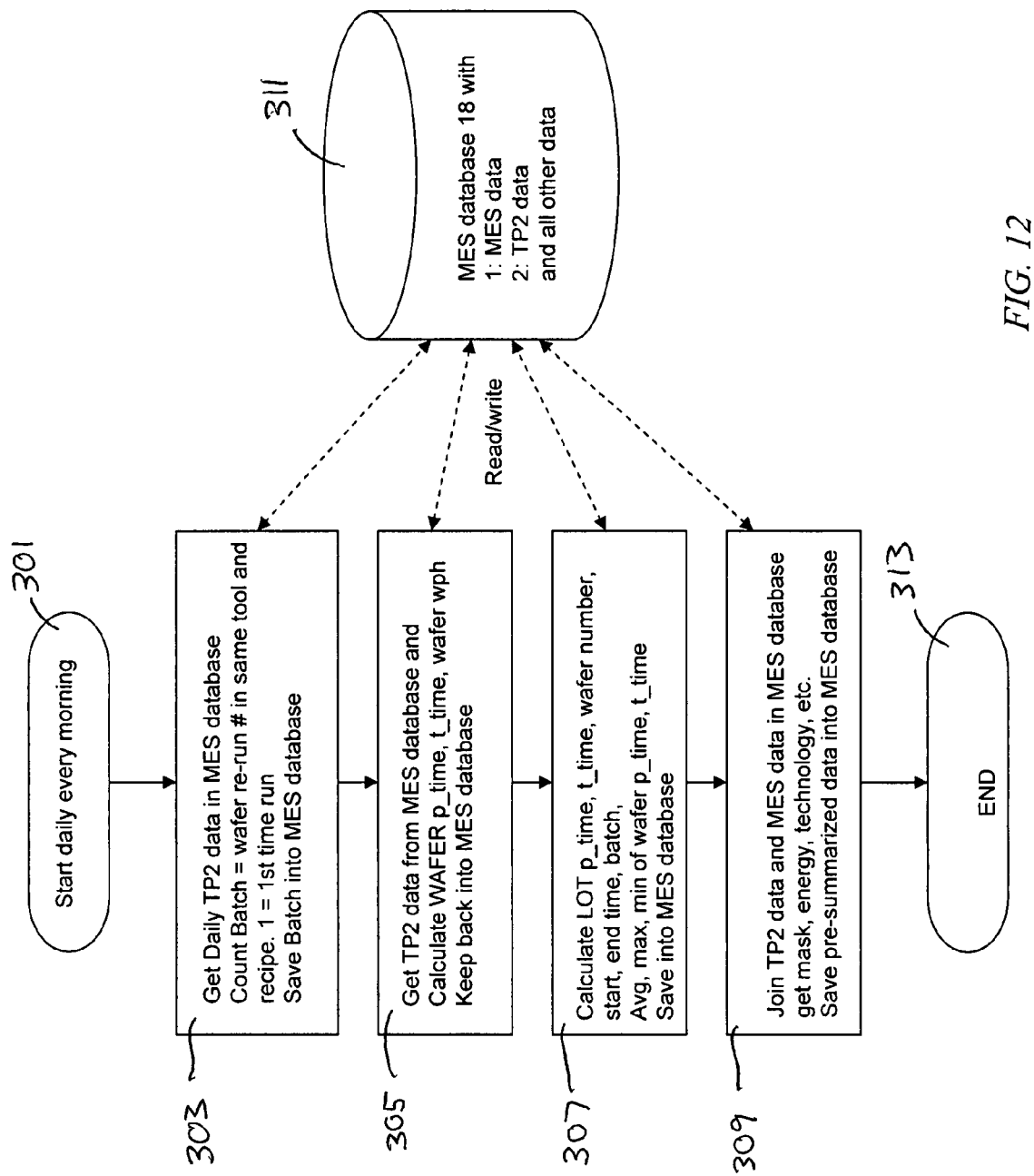
FIG. 12 is a flow chart of the data manipulation that takes place at the MES host.

FIG. 12 is a flow chart of the data manipulation that takes place at MES host 16. The process starts at step 301—Start daily every morning, which is an arbitrary and exemplary frequency. At step 303 daily TP2 data is obtained in MES database 18. Batch information is obtained including wafer re-run # in the same tool and recipe. Batch data is saved into MES database 18. Step 305 includes getting TP2 data from MES database 18, calculating WAFER p_time, t_time, wafer WPH and maintaining same in the MES database 18. Step 307 includes calculating LOT p_time, t_time, wafer number, start, end time, batch, avg., max, min. of wafer p_time, t_time and saving the same into MES database 18. Step 309 includes joining TP2 data and MES data in MES database 18 and obtaining mask, energy, technology, etc. data. The pre-summarized data is saved into MES database 18. Read/write operations exchange date between MES database 18 and the previously described steps at step 311, the MES database 18 including the MES data, TP2 data and all other data. The process end is at step 313.

Figure 13:
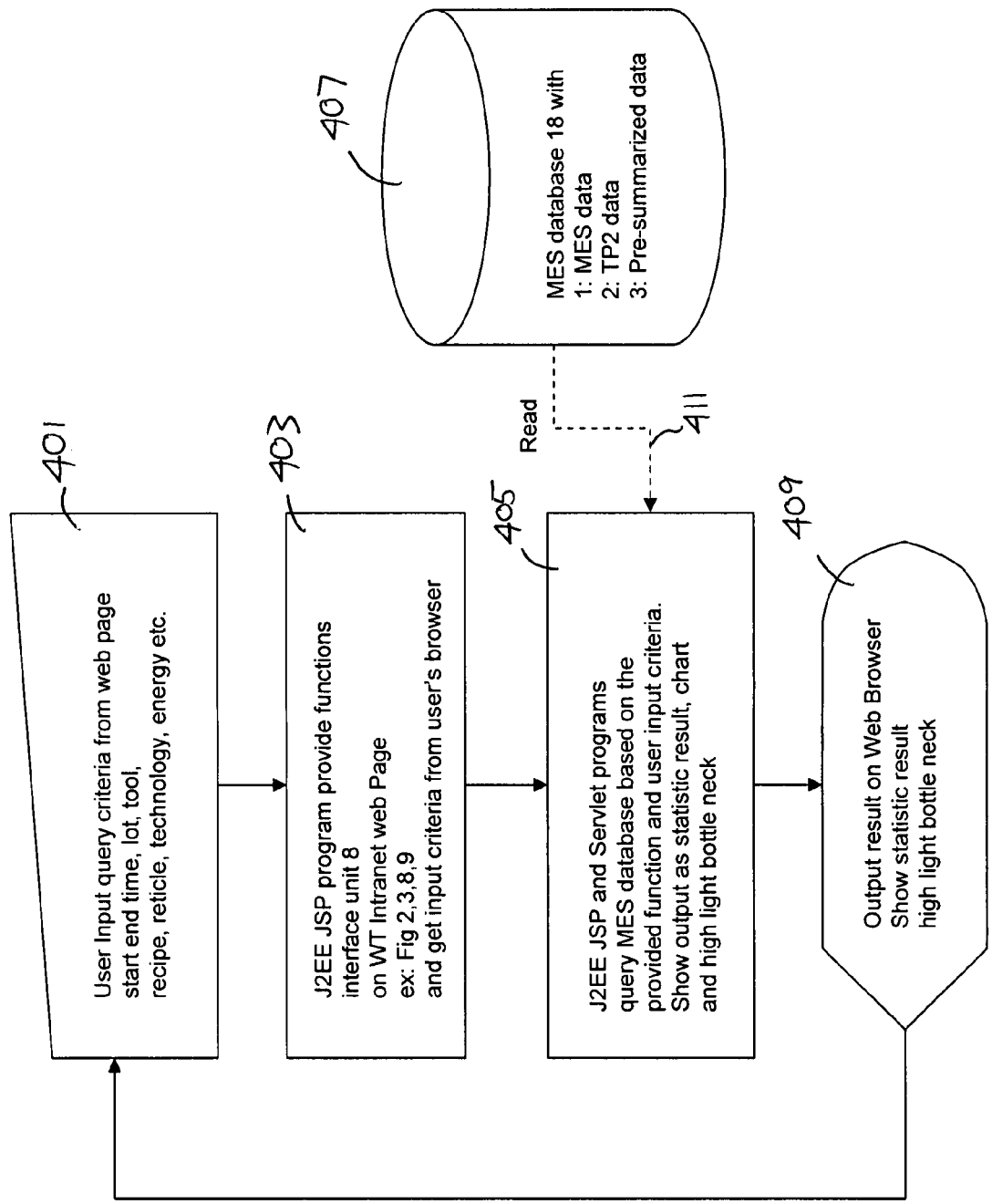
FIG. 13 is a flow chart of the data manipulation that takes place at the report server.

FIG. 13 is a flow chart of the data manipulation that takes place at report server 20, advantageously a J2EE Server with programs in Java, Servlet, JDBC or other suitable programs. Step 401 represents a user input query criteria from web page containing information such as start and end time, lot, tool, recipe, reticle, etc. At step 403 J2EE JSP program provides functions to interface unit 8 on WT Intranet web and gets input criteria from the user's browser. At step 405 J2EE JSP and Servlet programs query MES database 18 based on the provided function and user input criteria. An output of statistical results is provided, such as in a chart with bottlenecks highlighted. At step 407, MES data, TP2 data, and pre-summarized data from MES database 18 is read into report server 20. At step 409, results are output on web browser with statistical results shown and bottlenecks highlighted.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures or components are secured or attached to one another either directly or indirectly through intervening structures or components, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for comparing lithography processing time data in semiconductor device manufacturing, said method comprising:

obtaining wafer time log data from each of a plurality of lithography tools, said wafer time log data including times observed, measured and recorded at processing operations;

parsing said wafer time log data;

providing said wafer time log data to a database;

querying said database by specifying at least one fixed fabrication parameter of a plurality of fabrication parameters;

classifying said wafer time log data according to at least another one of said plurality of fabrication parameters and responsive to said querying; and identifying at least one lithography operation bottleneck based on said wafer time log data in said database, by generating a data display that identifies said at least one lithography operation bottleneck by comparing operation time data between at least one other of said fabrication parameters, said operation time data including wafer processing times and wafer transport times.

2. The method as in claim 1, further comprising instituting at least one change in at least one semiconductor device manufacturing operation based on said at least one lithography operation bottleneck.

3. The method as in claim 2, wherein said at least one change comprises at least one of increasing capacity of a manufacturing tool, altering product mix running through said manufacturing tool and making a mechanical adjustment to said manufacturing tool.

4. The method as in claim 1, where said operation time data includes average processing time, average transport time, maximum processing time, maximum transport time, minimum processing time and minimum transport time.

5. The method as in claim 1, wherein said plurality of fabrication parameters includes lot number, device level, reticle, process recipe, technology type, device type, and particular ones of said lithography tools.

6. The method as in claim 1. wherein said wafer time log data further includes programmed times.

7. The method as in claim 1, wherein said wafer time log data includes wafer transport times and wafer processing times.

8. The method as in claim 1, wherein said wafer time log data includes times at individual components of said lithography tools, said individual components including wafer coaters, cooling plates, developer heads, hard bake units, soft bake units, post-exposure bake units, exposure units, and adhesion treatment.

9. The method as in claim 1, wherein said querying includes specifying a first lithography tool of said plurality of lithography tools, and said comparing includes said other fabrication parameters including wafer coaters, cooling plates, developer heads, hard bake, soft bakes, post-exposure bakes, and adhesion treatments at said first lithography tool.

10. The method as in claim 1, wherein said wafer time log data includes processing times at individual components of a first lithography toot of said plurality of lithography tools, said individual components including wafer casters, cooling plates, developer heads, hard bake units, soft bake units, post-exposure bake units, and adhesion treatment units, said querying includes specifying said first lithography tool and a recipe, and said lithography operation bottleneck comprises an average unit processing time in one of said individual components that exceeds an average wafer exposure time at said first lithography tool.

11. The method as in claim 1, wherein said lithography operation bottleneck comprises one of wafer-to-wafer transfer within one of said lithography tools and lot-to-lot transfer at one of said lithography tools.

12. The method as in claim 1, wherein said querying comprises specifying a particular process recipe and said comparing includes comparing particular ones of said lithography tools.

13. The method as in claim 1, wherein said querying comprises a user entering said at least a first fabrication parameter into an interface screen and wherein said data display is displayed on said interface screen.

14. The method as in claim 1, wherein said generating a data display further comprises automatically highlighting said at least one lithography operation bottleneck.

15. A method for identifying lithography operation bottlenecks in semiconductor device manufacturing, said method comprising:

obtaining wafer time log data from at least one lithography tool, said wafer time log data including times observed, measured and recorded at processing operations;

parsing said wafer time log data;

providing said wafer time log data to a database;

querying said database by specifying at least one fixed fabrication parameter of a plurality of fabrication parameters;

classifying said wafer time log data according to at least another one of said plurality of fabrication parameters and responsive to said querying; and identifying at least one lithography operation bottleneck based on said wafer time log data in said database, by generating a data display that identifies said at least one lithography bottleneck by comparing operation time data between other of said fabrication parameters, said operation time data including average wafer processing times and average wafer transport times, said wafer time log data including processing and transport times for individual components of each said lithography tool, said individual components including wafer coaters, cooling plates, developer heads, hard bake units, soft bake units, post- exposure bake units, exposure, and adhesion treatment.

16. A computer readable medium with encoded instructions for performing a method for identifying lithography processing bottlenecks in semiconductor device manufacturing, the method comprising the operations of:

obtaining wafer time log data from each of a plurality of lithography tools, said wafer time log data including times observed, measured and recorded at processing operations;

parsing said wafer time log data;

providing said wafer time log data to a database;

correlating said wafer time log data;

receiving a query made of said database, said query specifying and fixing at least a first fabrication parameter of a plurality of fabrication parameters;

classifying said wafer time log data according to at least another one of said plurality of fabrication parameters and responsive to said query; and identifying at least one lithography operation bottleneck based on said wafer time log data in said database, by generating a data display that identifies said at least one lithography operation bottleneck by comparing operation time data between at least one other of said fabrication parameters, said operation time data including wafer processing times and wafer transport times.

17. The computer readable medium as in claim 16, wherein said wafer time log data includes wafer transport time and wafer processing times.

18. The computer readable medium as in claim 16, wherein said wafer time log data includes times for individual components of said lithography tools, said individual components including wafer coaters, cooling plates, developer heads, hard bake units, soft bake units, post-exposure bake units, exposure units, and adhesion treatment.

19. The computer readable medium as in claim 16, wherein said plurality of fabrication parameters include lot number, device level, reticle, process recipe, technology type, device type, and particular ones of said lithography tools.

20. The method as in claim 15, wherein said at least one lithography tool comprises one lithography tool and said identifying comprises identifying at least one lithography operation bottleneck in said one lithography tool.

* * * * *

UNITED STATES PATENT AND TRADEMARK OFFICE
CERTIFICATE OF CORRECTION

PATENT NO. : 7,489,982 B2  Page 1 of 1
APPLICATION NO. : 11/521871
DATED : February 10, 2009
INVENTOR(S) : Kun-Yi Liu and Dean Yi Liu It is certified that error appears in the above-identified patent and that said Letters Patent is hereby corrected as shown below:

Column 2, line 64, replace "operation" with --operations--
Column 11, line 41, claim 10, replace "toot" with --tool--
Column 11, line 42, claim 10, replace "casters" with --coaters--

Signed and Sealed this

Ninth Day of June, 2009

JOHN DOLL
*Acting Director of the United States Patent and Trademark Office*